(12) United States Patent
Kim

(10) Patent No.: US 7,466,372 B2
(45) Date of Patent: Dec. 16, 2008

(54) LIQUID CRYSTAL CELL CARRYING CASE

(75) Inventor: Hyo Jin Kim, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 629 days.

(21) Appl. No.: 10/992,208

(22) Filed: Nov. 19, 2004

(65) Prior Publication Data

US 2005/0110919 A1    May 26, 2005

(30) Foreign Application Priority Data

Nov. 21, 2003    (KR) ...................... 10-2003-0082849

(51) Int. Cl.
*G02F 1/13* (2006.01)
(52) U.S. Cl. ...................................................... 349/58
(58) Field of Classification Search ...................... 349/1, 349/58, 59, 60; 206/316.1, 706, 710, 711, 206/712, 722, 723
See application file for complete search history.

(56) References Cited

U.S. PATENT DOCUMENTS 4,717,021 A * 1/1988 Ditzig .................... 206/387.13
5,240,656 A * 8/1993 Scheeres .................. 264/297.1

FOREIGN PATENT DOCUMENTS

KR    10-2001-0091650    * 10/2001
KR    2003-0078534    10/2003

* cited by examiner

*Primary Examiner*—Dung Nguyen
*Assistant Examiner*—Tai Duong
(74) *Attorney, Agent, or Firm*—Morgan Lewis & Bockius LLP

(57) ABSTRACT

A liquid crystal cell carrying case includes a box having a cavity, first and second coupling parts along opposing sides of the cavity for securing a plurality of liquid crystal cells therebetween, and a cover for covering the box, the box and the cover being made of a resin material.

17 Claims, 4 Drawing Sheets

LIQUID CRYSTAL CELL CARRYING CASE

The present invention claims the benefit of Korean Patent Application No. 82849/2003 filed in Korea on Nov. 21, 2003, which is hereby incorporated by reference.

BACKGROUND OF THE INVENTION

1. Field of the Invention

The present invention relates to a liquid crystal display device, and more particularly, to a liquid crystal cell carrying case that prevents liquid crystal cells from being damaged.

2. Discussion of the Related Art

Demands for display devices have increased with development of information society. In particular, liquid crystal display (LCD) devices have been most widely used as flat display devices because of their advantageous characteristics of thin profile, lightness, and low power consumption.

In general, an LCD device includes an LCD panel for displaying an image and a driver for supplying a driving signal to the LCD panel. In addition, the LCD panel includes first and second substrates attached to each other with a cell gap therebetween, and a liquid crystal layer formed in the cell gap. The first substrate or a thin film transistor array substrate includes a plurality of thin film transistors formed thereon, and the second substrate or a color filter substrate includes a black matrix layer, a color filter layer, and a common electrode formed thereon.

The array substrate and the color filter substrate generally are manufactured by a plurality of mask processes. For example, the array substrate can be manufactured using a 5, 6, 7 or 8-mask process. Recently, the array substrate can be manufactured according to a 4-mask process using a diffraction exposure process.

In particular, multiple array/color filter substrates can be simultaneously manufactured on one mother substrate. For instance, a first mother substrate may undergo mask processes to form a plurality of array substrates, and a second mother substrate may undergo different mask processes to form a plurality of color filter substrates. Then, the first and second mother substrates are bonded to each other and cut, thereby forming a plurality of bonded substrates. Then, a liquid crystal material is injected between each of the bonded substrates. Thereafter, a gate PCB and a data PCB are attached to a pad region of the bonded substrates. Thus, a plurality of liquid crystal panels are formed. The liquid crystal panels are also referred to "liquid crystal cells".

In general, after being formed, the liquid crystal cells are moved and transferred to next processes. When transferring the liquid crystal cells, the stability must be maintained because the liquid crystals are already injected between the bonded substrates. Typically, the liquid crystal cells are loaded into a case and then transferred with the case.

FIG. 1 is a planar view illustrating an inside of a liquid crystal cell carrying case according to the related art. In FIG. 1, a liquid crystal cell carrying case 100 includes first and second cell fixing parts 101 and 102 along opposing sides of the carrying case 100. The liquid crystal cell carrying case 100 is made of a plastic material using an injection molding method The first and second cell fixing parts 101 and 102 are detachably installed inside the carrying case 100 and they can be moved along the width of the carry case depending on sizes of the liquid crystal cells 110. For example, the first cell fixing part 101 can be separated from the carrying case 100 and then fit into a predetermined position of the carrying case 100, so that a gap between the first cell fixing part 101 and the second cell fixing part 102 corresponds to the width of the liquid crystal cells 110.

In addition, the first and second cell fixing parts 101 and 102 respectively include first and second support members 105a and 105b, and a plurality of coupling protrusions 103 are arranged at a constant interval along each of the first and second support members 105a and 105b. Thus, the liquid crystal cells 110 are coupled and fixed by the coupling protrusions 103. Further, side surfaces of each of the coupling protrusions 103 are inclined with respect to their extending direction.

FIG. 2 is a side view of the liquid crystal cell carrying case shown in FIG. 1. As shown in FIG. 2, the first and second fixing parts 101 and 102 can be separated from the liquid crystal cell carrying case 100 and they can be moved along the width of the carry case depending on the sizes of the liquid crystal cells 110. In particular, the liquid crystal cells 110 are inserted into the coupling protrusions 103 (shown in FIG. 1), such that the gap between the liquid crystal cells 110 can be constantly maintained. In addition, a case cover 120 is coupled to the liquid crystal cell carrying case 100 by case coupling parts 130 that are at both sides of the liquid crystal cell carrying case 100.

However, since the liquid crystal cell carrying case according to the related art is made of a plastic material, which has a low melting temperature and is not elastic, the liquid crystal cell carrying case is easily melted or bent by heat and is easily damaged by external impacts. In particular, an external impact is transferred through the liquid crystal cell carrying case to the liquid crystal cells that are carried inside the case. Thus, if the external impact is strong, the liquid crystal cells are damaged. Also, since both sides of the coupling protrusions have the inclined side surfaces, an apparatus for placing the liquid crystal cells in parallel with each other is required.

SUMMARY OF THE INVENTION

Accordingly, the present invention is directed to a liquid crystal cell carrying case that substantially obviates one or more of the problems due to limitations and disadvantages of the related art.

An object of the present invention is to provide a liquid crystal cell carrying case that effectively prevents liquid crystal cells from being damaged.

Another object of the present invention is to provide a liquid crystal cell carrying case that prevents foreign materials from being introduced to liquid crystal cells that are carried within.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, a liquid crystal cell carrying case includes a box having a cavity, first and second coupling parts along opposing sides of the cavity for securing a plurality of liquid crystal cells therebetween, and a cover for covering the box, the box and the cover being made of a resin material.

In another aspect, a liquid crystal cell carrying case includes a box having a cavity, first and second coupling parts along opposing sides of the cavity for securing a plurality of liquid crystal cells therebetween, the first and second coupling parts being integrally formed with the box as a single body, each of the first and second coupling parts including a plurality of protrusions, each of the protrusions having a first surface being substantially parallel to an edge of the box and a second surface being inclined with respect to the same edge of the box, and a cover for covering the box.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
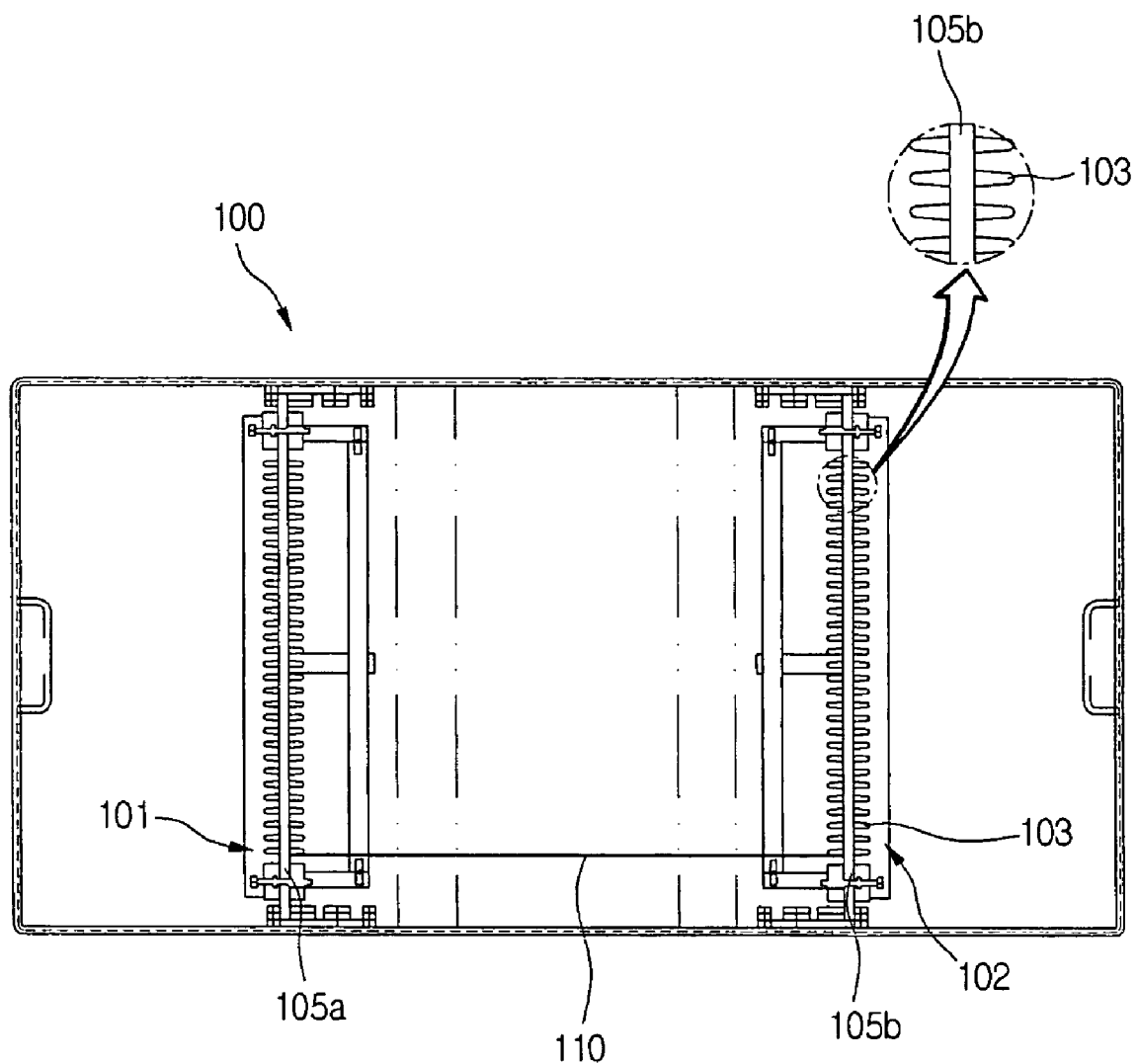
FIG. 1 is a planar view illustrating an inside of a liquid crystal cell carrying case according to the related art.
Figure 2:
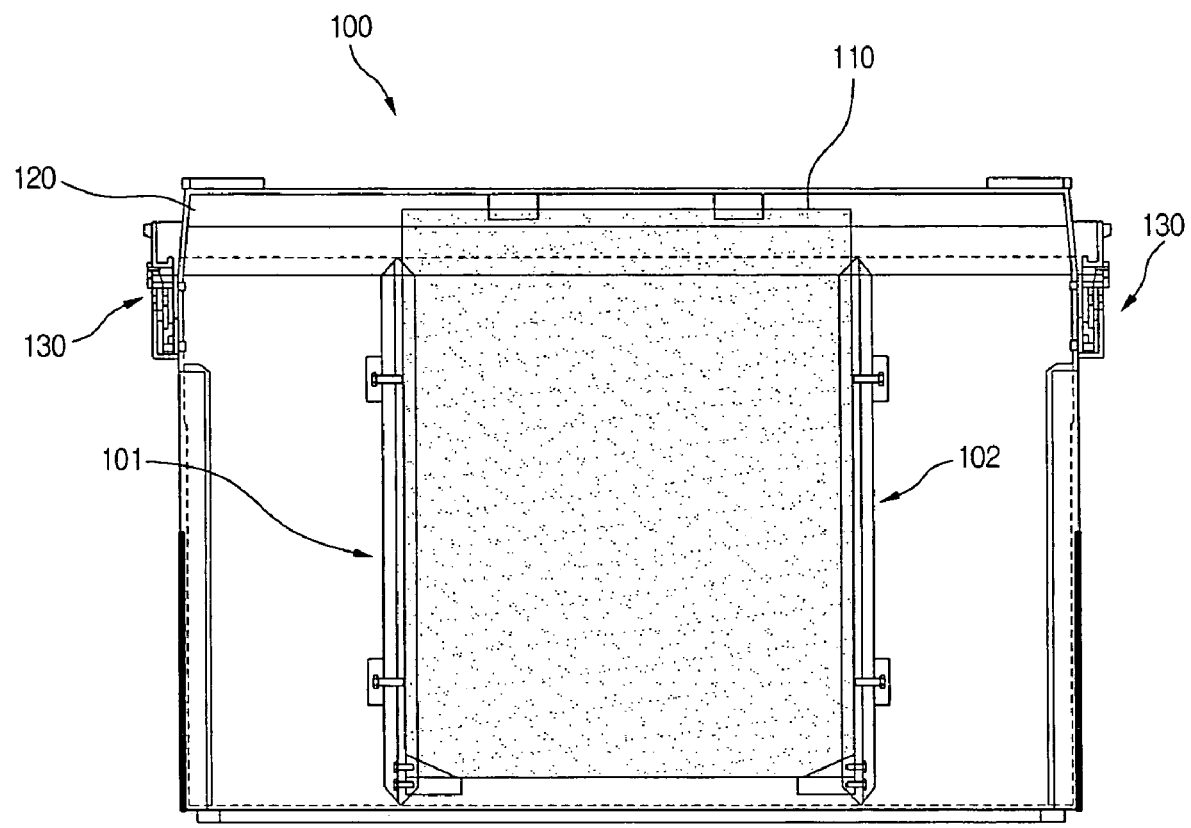
FIG. 2 is a side view of the liquid crystal cell carrying case shown in FIG. 1.
Figure 3:
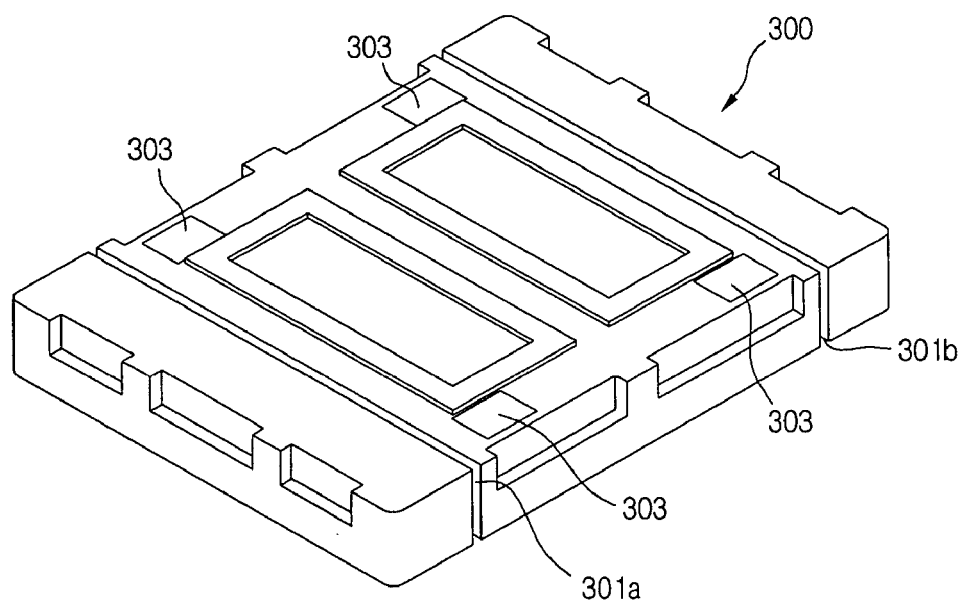
FIG. 3 is an exploded perspective view of a liquid crystal cell carrying case according to an embodiment of the present invention.
Figure 3:
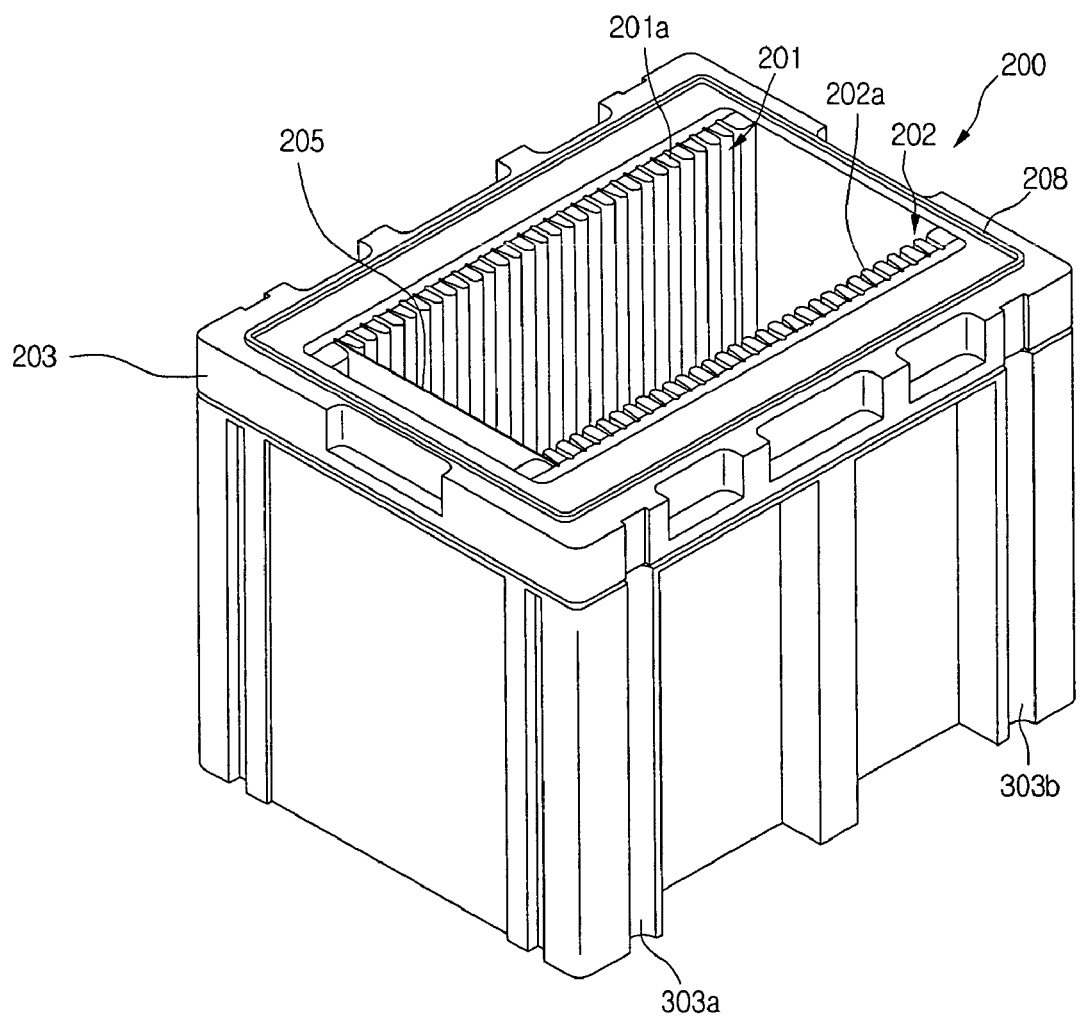

FIG. 3 is an exploded perspective view of a liquid crystal cell carrying case according to an embodiment of the present invention. In FIG. 3, a liquid crystal cell carrying case includes a liquid crystal cell containing box 200 and a cover 300. The liquid crystal cell containing box 200 has a cavity and includes first and second coupling parts 201 and 202 for securing one or more liquid crystal cell(s) within the cavity. The liquid crystal cell containing box 200 may hold more than one liquid crystal cells 205, and the sizes of the liquid crystal cell containing box 200 and its cavity may be made based on the desired number of liquid crystal cells to be carried within.

In addition, the first and second coupling parts 201 and 202 respectively include a plurality of first and second coupling protrusions 201a and 202a at a same interval along opposing sides of the liquid crystal cell containing box 200. The first coupling protrusions 201a may be continuous and may be formed integrally. Similarly, the second coupling protrusions 202a may be continuous and may be formed integrally. As a result, the first and second coupling parts 201 and 202 may have alternating concave-convex shapes, and the liquid crystal cells 205 may be inserted and secured between the coupling protrusions 201a and 202a.

In particular, the first and second coupling protrusions 201a and 202a may have different sizes. For instance, the gaps between the coupling protrusions 201a and 202a may be small to maximize the box's carrying capability; however, it may be difficult to unload the liquid crystal cells 205 due to the small gaps. Thus, the coupling protrusions 201a and 202a that are closest to edges of the liquid crystal cell containing box 200 may be made larger than the other coupling protrusions 201a and 202a, such that the liquid crystal cells 205 closest to the edges could be unloaded first, thereby providing more space for unloading other liquid crystal cells 205.

Further, the first and second coupling parts 201 and 202 may be formed integrally with the liquid crystal cell containing box 200 as a single body by a smooth cellular molding method. In particular, the liquid crystal cell containing box 200 and the first and second coupling parts 201 and 202 may include an EPP material, an EPE material, or a combination of EPP and EPE materials. For example, EPE, which is a polyethylene-based resin, may be used as a material for an inner portion of the liquid crystal cell containing box 200, and EPP, which is a polypropylene-based resin, may be used as a material for an outer portion of the liquid crystal cell containing box 200.

Moreover, the cover 300 may be coupled to an upper portion of the liquid crystal cell containing box 200 and may cover an opening of the liquid crystal cell containing box 200. The cover 300 also may be formed by a smooth cellular molding method and may include an EPP material, an EPE material, or a combination of EPP and EPE materials. For example, EPE may be used as a material for an inner portion of the cover 300, and EPP may be used as a material for an outer portion of the cover 300.

In addition, the cover 300 may be uncoupled from the liquid crystal cell containing box 200 when loading and unloading the liquid crystal cells 205. In particular, the cover 300 includes a plurality of vacuum grooves 303 on its upper surface to facilitate an easy opening of the cover 300. For example, a robot or the like may be attached to the vacuum grooves 303 to discharge air existing in the vacuum grooves 303, thereby forming a vacuum state. In this vacuum state, the cover 300 moves upward such that it is easily opened.

Further, a rubber band 203 is installed along a horizontal circumference of the upper portion of the liquid crystal cell containing box 200. A coupling portion 208 is formed on the rubber band 203 to reinforce a coupling force between the cover 300 and the liquid crystal cell containing box 200. In particular, the rubber band 203 formed on the liquid crystal cell containing box 200 is closely attached to the cover 300. Thus, the cover 300 is firmly coupled to the liquid crystal cell containing box 200 by the coupling part 208, thereby preventing foreign objects from being introduced to the cavity of the liquid crystal cell containing box 200.

Furthermore, first and second belt grooves 301a and 301b are formed on the outside of the cover 300, and third and fourth belt grooves 303a and 303b are formed on the outside of the liquid crystal cell containing box 200. The first belt groove 301a may correspond to the third belt groove 303a, and the second belt groove 301b may correspond to the fourth belt groove 303b, such that one or more belts may be fastened within the belt grooves 301a, 301b, 303a and 303b and around the cover 300 and the liquid crystal cell containing box 200. As a result, a coupling force between the cover 300 and the liquid crystal cell containing box 200 is further reinforced.

Thus, unlike the liquid crystal cell carrying case according to the related art, which is made using a plastic injection molding, the liquid crystal cell carrying case according to an embodiment of the present invention includes a liquid crystal cell containing box and a cover made of one of the smooth EPP and EPE material or a combination thereof. In addition, the liquid crystal cell containing box and the cover are coupled to each other securely with reinforcement of a rubber band and/or belts. Accordingly, the liquid crystal cell carrying case according to an embodiment of the present invention is effective in absorbing an external impact and vibration, thereby providing additional protections to the liquid crystal cells loaded within and further preventing the liquid crystal cells from being damaged.

Figure 4:
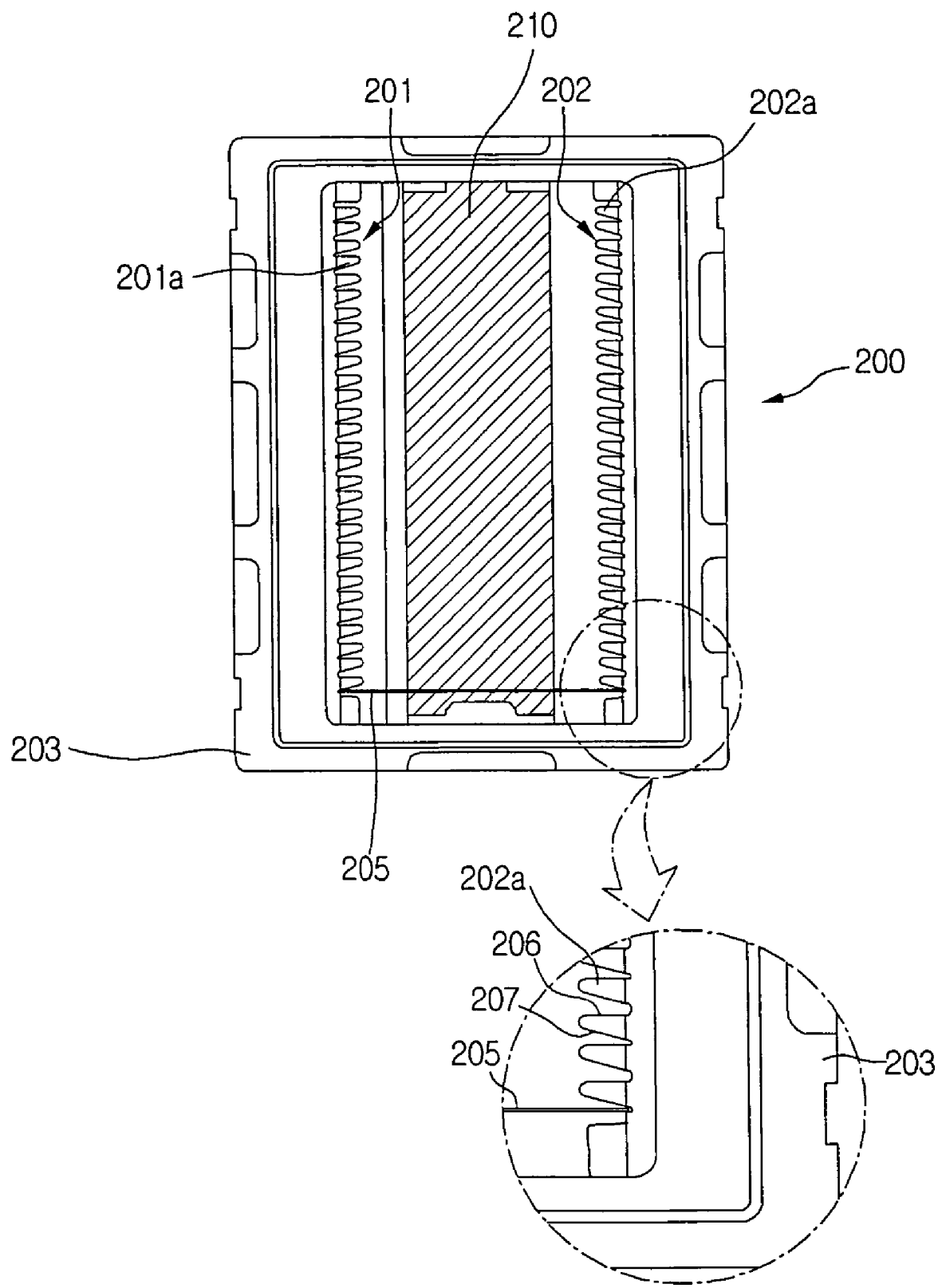
FIG. 4 is a planar view illustrating an inside of the liquid crystal cell containing box shown in FIG. 3.

FIG. 4 is a planar view illustrating an inside of the liquid crystal cell containing box shown in FIG. 3. As shown in FIG. 4, a pad 210 is at a bottom surface of the cavity of the liquid crystal cell containing box 200. The pad 210 may be detachably installed in the liquid crystal cell containing box 200. Alternatively, the pad 210 may be formed separately from or integrally with the liquid crystal cell containing box 200. In addition, the pad 210 may include an EPP material, an EPE material, a combination of EPP and EPE materials, or any material having an elastic or deformable property. Thus, as the liquid crystal cells 205 are loaded within the liquid crystal cell containing box 200, lower portions of the liquid crystal cells 205 contact the pad 210 without being damaged. Further, when a strong impact is exerted onto the liquid crystal cell containing box 200, this impact is absorbed into the pad 210, rather than transferred to the liquid crystal cells 205, thereby preventing damages to the liquid crystal cells 205.

In addition, each of the coupling protrusions 201a and 202a has a first surface 206, which is parallel to an edge of the liquid crystal cell containing box 200, and a second surface 207, which is inclined with respect to the same edge of the liquid crystal cell containing box 200. As a result, as the liquid crystal cells 205 are loaded in the liquid crystal cell containing box 200, the liquid crystal cells 205 may contact the first surface 206 of the respective coupling protrusions 201a and 202a. Thus, the liquid crystal cells 205 may be loaded in parallel with each other, and the liquid crystal cells 205 may horizontally unloaded without any right or left inclination. Accordingly, an additional apparatus for placing the liquid crystal cells 205 in parallel with each other is not needed.

As described above, the liquid crystal cell carrying case according to an embodiment of the present invention includes a liquid crystal cell containing box and a cover made of one of the smooth EPP and EPE material or a combination thereof to effectively prevent liquid crystal cells, that are loaded within, from being damaged or peeled due to an external impact during transfer. Further, the liquid crystal cell carrying case according to an embodiment of the present invention includes a rubber band formed on the upper circumference of the liquid crystal cell containing box and securely attached to the cover, thereby preventing foreign objects from entering to the inside of the liquid crystal cell carrying case.

It will be apparent to those skilled in the art that various modifications and variations can be made in the liquid crystal cell carrying case of the present invention without departing from the sprit or scope of the invention. Thus, it is intended that the present invention covers the modifications and variations of this invention provided they come within the scope of the appended claims and their equivalents.

What is claimed is:

1. A liquid crystal cell carrying case comprising:
a box having a cavity;
first and second coupling parts along opposing sides of the cavity for securing a plurality of liquid crystal cells therebetween; and
a cover for covering the box, the box and the cover being made of a resin material,
wherein the first and second coupling parts include a plurality of protrusions,
wherein each of the protrusions includes a first surface being substantially parallel to an edge of the box and a second surface being inclined with respect to the same edge of the box,
wherein four of the coupling protrusions that are closest to the edge of the box have a larger width than other coupling protrusions.

2. The liquid crystal cell carrying case according to claim 1, wherein the resin includes one of a polyethylene-based resin, a polypropylene-based resin and a combination thereof.

3. The liquid crystal cell carrying case according to claim 1, wherein an inner portion of the box is made of a polyethylene-based resin, and an outer portion of the box is made of a polypropylene-based resin.

4. The liquid crystal cell carrying case according to claim 1, wherein an inner portion of the cover is made of a polyethylene-based resin, and an outer portion of the cover is made of a polypropylene-based resin.

5. The liquid crystal cell carrying case according to claim 1, further comprising a pad at a bottom surface of the cavity.

6. The liquid crystal cell carrying case according to claim 5, wherein the pad is detachably installed at the bottom surface of the cavity.

7. The liquid crystal cell carrying case according to claim 1, further comprising a rubber band formed along an upper circumference of the box, the rubber band attaching the box and the cover to each other.

8. The liquid crystal cell carrying case according to claim 1, wherein the first and second coupling parts have alternative concave-convex shapes.

9. The liquid crystal cell carrying case according to claim 1, further comprising a plurality of belt grooves on outer surfaces of the box and the cover.

10. The liquid crystal cell carrying case according to claim 1, further comprising a plurality of vacuum grooves on an upper surface of the cover.

11. A liquid crystal cell carrying case comprising:
a box having a cavity;
first and second coupling parts along opposing sides of the cavity for securing a plurality of liquid crystal cells therebetween, the first and second coupling parts being integrally formed with the box as a single body, each of the first and second coupling parts including a plurality of protrusions, each of the protrusions having a first surface being substantially parallel to an edge of the box and a second surface being inclined with respect to the same edge of the box; and
a cover for covering the box,
wherein four of the coupling protrusions that are closest to the edge of the box have a larger width than other coupling protrusions.

12. The liquid crystal cell carrying case according to claim 11, wherein the box and the cover include one of a polyethylene-based resin, a polypropylene-based resin and a combination thereof.

13. The liquid crystal cell carrying case according to claim 11, wherein inner portions of the box and the cover are made of a polyethylene-based resin, and outer portions of the box and the cover are made of a polypropylene-based resin.

14. The liquid crystal cell carrying case according to claim 11, further comprising a rubber band formed along an upper circumference of the box, the rubber band attaching the box and the cover to each other.

15. The liquid crystal cell carrying case according to claim 11, further comprising a pad at a bottom surface of the cavity.

16. The liquid crystal cell carrying case according to claim 11, further comprising a plurality of belt grooves on outer surfaces of the box and the cover.

17. The liquid crystal cell carrying case according to claim 11, further comprising a plurality of vacuum grooves on an upper surface of the cover.

* * * * *